United States Patent
Kawaguchi

(10) Patent No.: US 10,672,945 B2
(45) Date of Patent: Jun. 2, 2020

(54) METHOD FOR MANUFACTURING LIGHT EMITTING DEVICE

(71) Applicant: NICHIA CORPORATION, Anan-shi, Tokushima (JP)

(72) Inventor: Hirofumi Kawaguchi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/115,489

(22) Filed: Aug. 28, 2018

(65) Prior Publication Data

US 2019/0074402 A1    Mar. 7, 2019

(30) Foreign Application Priority Data

Sep. 1, 2017   (JP) .................. 2017-168735

(51) Int. Cl.
| | |
|---|---|
| H01L 33/00 | (2010.01) |
| H01L 33/38 | (2010.01) |
| H01L 33/62 | (2010.01) |
| H01L 33/42 | (2010.01) |
| H01L 21/786 | (2006.01) |
| H01L 33/40 | (2010.01) |
| H01L 33/32 | (2010.01) |

(52) U.S. Cl.
CPC .......... *H01L 33/007* (2013.01); *H01L 21/786* (2013.01); *H01L 33/0079* (2013.01); *H01L 33/32* (2013.01); *H01L 33/38* (2013.01); *H01L 33/405* (2013.01); *H01L 33/42* (2013.01); *H01L 33/62* (2013.01); *H01L 33/325* (2013.01); *H01L 2933/0016* (2013.01)

(58) Field of Classification Search
CPC ........................ H01L 33/0079; H01L 33/42
See application file for complete search history.

(56) References Cited

U.S. PATENT DOCUMENTS

| | | | | |
|---|---|---|---|---|
| 7,488,613 B2* | 2/2009 | Kunisato | ............. | H01L 33/0079 257/79 |
| 2005/0189551 A1* | 9/2005 | Peng | ................... | H01L 25/0756 257/94 |

(Continued)

FOREIGN PATENT DOCUMENTS

| | | |
|---|---|---|
| JP | H05-251739 A | 9/1993 |
| JP | 2005-019874 | 1/2005 |

(Continued)

*Primary Examiner* — Farun Lu
(74) *Attorney, Agent, or Firm* — Foley & Lardner LLP

(57) ABSTRACT

A method of manufacturing a light emitting device includes: a first wafer preparation step including preparing, on a first substrate, m first wafers (where m≥2), each of the first wafers comprising a first semiconductor layer, an active layer, and a second semiconductor layer; a second wafer preparation step including bonding a second substrate with the second semiconductor layer of a first of the m first wafers and then removing the first substrate from the first wafer, so as to form a second wafer in which the first semiconductor layer is exposed; and a first bonding step including bonding the first semiconductor layer exposed at the surface of the second wafer and the second semiconductor layer of a second of the m first wafers together using a light-transmissive conductive layer, and then removing a first substrate of the second of the m first wafers.

20 Claims, 9 Drawing Sheets

(56) References Cited

U.S. PATENT DOCUMENTS

| | | |
|---|---|---|
| 2010/0032691 A1 | 2/2010 | Kim |
| 2011/0244611 A1 | 10/2011 | Kim |
| 2012/0305954 A1 | 12/2012 | Kim |
| 2013/0221321 A1* | 8/2013 | Sheu ................. H01L 33/06 257/13 |
| 2013/0292714 A1 | 11/2013 | Kim |
| 2014/0124818 A1* | 5/2014 | Hwang ............ H01L 33/0079 257/99 |
| 2016/0064439 A1* | 3/2016 | Or-Bach .......... H01L 27/14634 257/443 |
| 2016/0093773 A1 | 3/2016 | Sano |
| 2016/0104824 A1* | 4/2016 | Furuyama ............... H01L 33/46 257/98 |
| 2017/0092812 A1 | 3/2017 | Sano |

FOREIGN PATENT DOCUMENTS

| | | |
|---|---|---|
| JP | 2010-041057 | 2/2010 |
| JP | 2016-072494 | 5/2016 |

* cited by examiner

METHOD FOR MANUFACTURING LIGHT EMITTING DEVICE

CROSS-REFERENCE TO RELATED APPLICATIONS

This application claims priority to Japanese Patent Application No. 2017-168735, filed on Sep. 1, 2017, the disclosure of which is hereby incorporated by reference in its entirety.

BACKGROUND

The present disclosure relates to a method for manufacturing a light emitting device.

In recent years, light emitting diodes, such as white LEDs, have enhanced luminance and are thus widely used as light sources for illumination and the like. As applications of light emitting diodes are expanded, the light emitting diodes are required to have even higher luminance. JP 2010-41057 A discloses a light emitting device that includes a plurality of light-emitting diode chips vertically stacked on each other in order to improve the light emission efficiency per unit area.

However, in the light emitting device disclosed in JP 2010-41057 A, either a positive or negative electrode is provided for each light-emitting diode chip, and hence such a light emitting device needs to secure a region for forming one electrode for each light-emitting diode chip. This leads to a problem that a formation range per unit area of an active layer inevitably becomes smaller.

SUMMARY

Therefore, it is an object of the present invention to provide a method for manufacturing a light emitting device with a plurality of light emitting portions stacked on each other, which is capable of enlarging a formation range per unit area of an active layer.

In one embodiment, a method of manufacturing a light emitting device comprises:

a first wafer preparation step of preparing m first wafers (where m≥2), each of the first wafers comprising a first semiconductor layer of a first conductivity type, an active layer, and a second semiconductor layer of a second conductivity type different from the first conductivity type, on a first substrate in sequence from a side of the first substrate;

a second wafer preparation step of preparing a second wafer that the first semiconductor layer is exposed at a surface of the second wafer by bonding a second substrate with the second semiconductor layer of one of the m first wafers and then removing the first substrate from the first wafer; and a first bonding step of bonding the first semiconductor layer exposed at the surface of the second wafer and a second semiconductor layer of another first wafer of the m first wafers together using a light-transmissive conductive layer, and then removing a first substrate of the another first wafer to expose a first semiconductor layer of the another first wafer at the surface thereof after the removal, if m is greater than 2 (m>2), the method further including, a second bonding step of bonding the first semiconductor layer exposed by removing the first substrate in the first bonding step and a second semiconductor layer of one remaining first wafer together using a light-transmissive conductive layer, and then removing a first substrate of the one remaining first wafer to expose a first semiconductor layer of the one remaining first wafer at the surface thereof after the removal.

With the above-mentioned configuration, the method for manufacturing a light emitting device according to the embodiment can allow for easy manufacturing of the light emitting device with a plurality of light emitting portions stacked on each other, which is capable of enlarging a formation range per unit area of the active layer.

DETAILED DESCRIPTION

A light emitting device and a method for manufacturing the same according to an embodiment will be described below with reference to the accompanying drawings.

Figure 1:
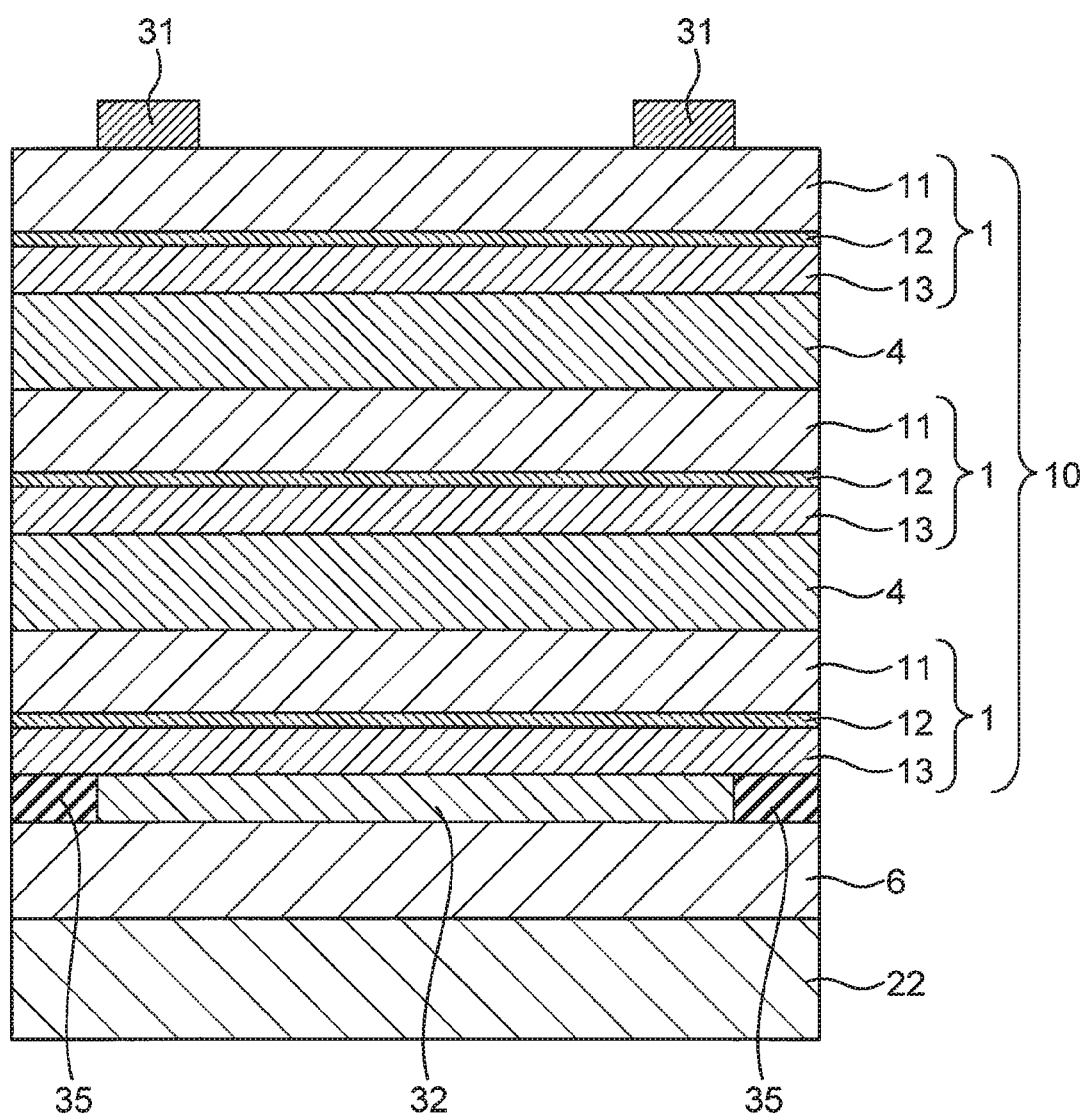
FIG. 1 is a cross-sectional view showing a structure of a light emitting device according to an embodiment.

FIG. 1 is a cross-sectional view showing a structure of a light emitting device according to the embodiment.

As shown in FIG. 1, the light emitting device of the embodiment has a stacked light emitting portion 10 including a plurality of unit light emitting portions 1 disposed over a substrate 22. In the light emitting device of the embodiment, a light-transmissive conductive layer 4 formed of, for example, indium tin oxide (ITO) is provided between the adjacent unit light emitting portions 1. Light emitted from the unit light emitting portion 1 provided in a lower layer, located on the side of the substrate 22, is emitted from a surface of the light emitting device opposite to the substrate 22 via the light-transmissive conductive layers 4 and other unit light emitting portions 1 provided in upper layers.

As used herein, the term "unit light emitting portion 1" means a light emitting portion including one active layer 12. Specifically, the unit light emitting portion 1 includes a first semiconductor layer 11 of a first conductivity type, the active layer 12, and a second semiconductor layer 13 of a second conductivity type different from the first conductivity type, in this order from the side of the light emitting surface (upper surface opposite to the substrate 22). As used herein, the term "first conductivity type" means the conductivity type of one of an n-type and a p-type, and the term "second conductivity type" means the other type.

The active layer 12 may be formed of a single layer or may be a single or multiple quantum well structure formed of a plurality of layers. The different unit light emitting portions 1 may have different emission wavelengths of their active layers 12. Each of the first semiconductor layer 11 and the second semiconductor layer 13 may be formed of a single layer or a plurality of layers. The first semiconductor layer 11 may partially include a layer that is not of the first conductivity type, for example, an undoped semiconductor layer. Meanwhile, the second semiconductor layer 13 may partially include a layer that is not of the second conductivity type, for example, an undoped semiconductor layer. As used herein, the term "undoped semiconductor layer" means a layer that is grown without adding any impurity of the first or second conductivity type when growing the layer. For example, the undoped semiconductor layer may contain an inevitable impurity mixed therein from an adjacent layer by diffusion or the like.

In the light emitting device of the embodiment, the stacked light emitting portion 10 is bonded with a substrate 22 using a metal layer 6. Between the stacked light emitting portion 10 and the metal layer 6, a second electrode 32 is provided in connection with a second semiconductor layer 13 of the unit light emitting portion 1, which is positioned closest to the substrate 22. Thus, for example, by using a conductive semiconductor substrate or a substrate made of metal as the substrate 22, power can be supplied to the stacked light emitting portion 10 via the substrate 22. In the light emitting device of the embodiment, as shown in FIG. 1, first electrodes 31 are provided on a surface of the first semiconductor layer 11 in the uppermost unit light emitting portion 1, positioned on the side opposite to the substrate 22. Furthermore, as mentioned above, the light-transmissive conductive layer 4 is provided between the adjacent unit light emitting portions 1, so that the unit light emitting portions 1 are electrically connected to each other. As mentioned above, the unit light emitting portions 1 are connected in series between the first electrode 31 and the second electrode 32, and thus, by applying a voltage between the first electrode 31 and the second electrode 32, the stacked light emitting portion 10 (all of a plurality of unit light emitting portions 1) can emit light therefrom.

Figure 2:
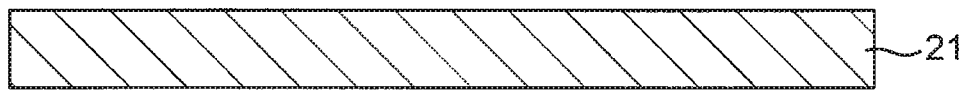
FIG. 2 is a cross-sectional view of a first substrate prepared in a method for manufacturing the light emitting device according to the embodiment.
Figure 3:
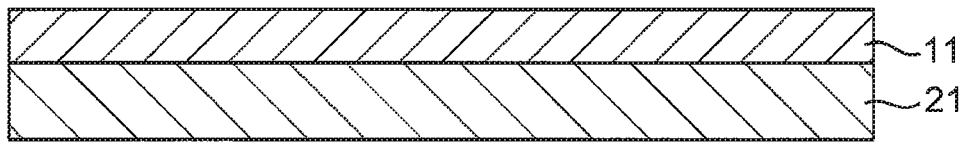
FIG. 3 is a cross-sectional view of a first semiconductor layer formed on an upper surface of the prepared first substrate in the method for manufacturing the light emitting device according to the embodiment.

A method for manufacturing the light emitting device according to the embodiment will be described below.
<First Wafer Preparation Step>
In a first wafer preparation step, for example, a first substrate 21 made of Si is prepared (see FIG. 2), and subsequently, for example, a first conductivity type contact layer and a first conductivity type cladding layer are grown over the first substrate 21 in sequence to form the first semiconductor layer 11 of the first conductivity type. Consequently, the first semiconductor layer 11 includes the first conductivity type contact layer and the first conductivity type cladding layer in this order from the side of the first substrate 21 (see FIG. 3). Note that the first semiconductor layer 11 may be formed over the first substrate 21 via a buffer layer.

Figure 4:
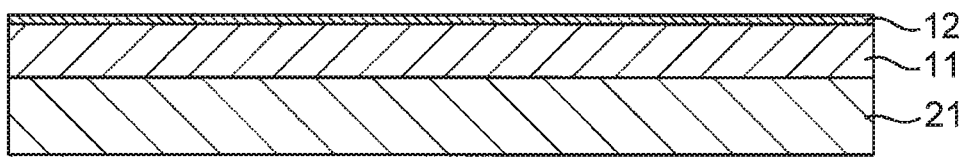
FIG. 4 is a cross-sectional view of an active layer formed on the first semiconductor layer, which has been formed on the upper surface of the first substrate, in the method for manufacturing the light emitting device according to the embodiment.

Then, the active layer 12 is formed over the first semiconductor layer 11 (see FIG. 4).

Figure 5:
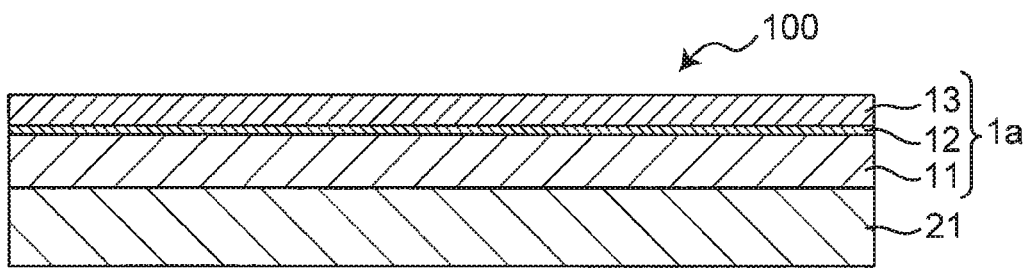
FIG. 5 is a cross-sectional view of a first wafer in which a second semiconductor layer is formed on the active layer, formed over the upper surface of the first substrate via the first semiconductor layer, in the method for manufacturing the light emitting device according to the embodiment.

Subsequently, for example, a second conductivity type cladding layer and a second conductivity type contact layer are grown in sequence on the active layer 12 to form a second semiconductor layer 13 of the second conductivity type. Consequently, the second semiconductor layer 13 includes the second conductivity type cladding layer and the second conductivity type contact layer in this order from the side of the active layer 12 (see FIG. 5).

The above-mentioned steps are repeatedly performed on m first substrates 21 to prepare m first wafers 100 (note that m≥2), each of the first wafers having a unit stacked structure 1a that includes the first semiconductor layer 11 of the first conductivity type, the active layer 12, and the second semiconductor layer 13 of the second conductivity type, respectively formed over the first substrate 21.

<Second Wafer Preparation Step>

To begin with, in a second wafer preparation step, second electrodes 32 with a predetermined pattern are formed on the second semiconductor layer 13 of one first wafer, for example, in the following way.

Figure 6:
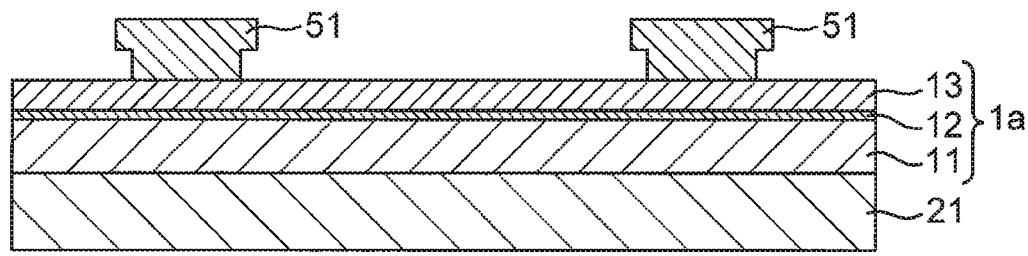
FIG. 6 is a cross-sectional view of a resist for forming second electrodes, which is formed on the second semiconductor layer of the first wafer, in the method for manufacturing the light emitting device according to the embodiment.

First, a resist 51 is formed on the second semiconductor layer 13 of one first wafer 100 from among the m first wafers prepared in the first wafer preparation step (see FIG. 6). Here, for example, the resist 51 is formed on portions of the second semiconductor layer 13 where the second electrodes are not to be formed.

Figure 7:
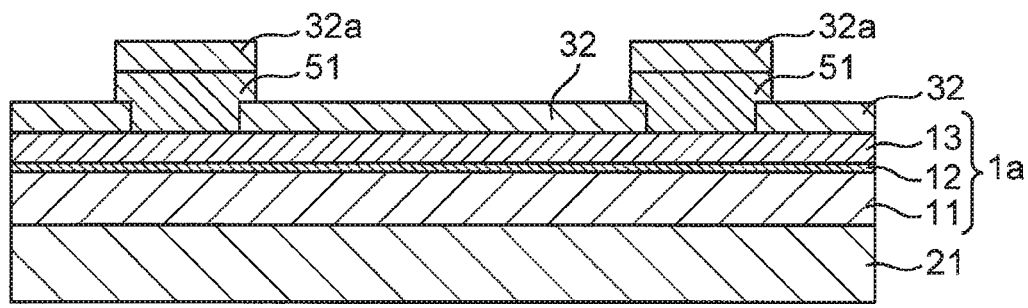
FIG. 7 is a cross-sectional view of a metal film for forming the second electrodes, which is formed on the second semiconductor layer of the first wafer, in the method for manufacturing the light emitting device according to the embodiment.

Then, a metal film (32, 32 *a*), for example, containing Ag, is formed over the entire upper surface of the second semiconductor layer 13 (see FIG. 7). Consequently, as shown in FIG. 7, the second electrodes 32 are formed on portions of the second semiconductor layer 13 where the resist 51 is not formed.

Figure 8:
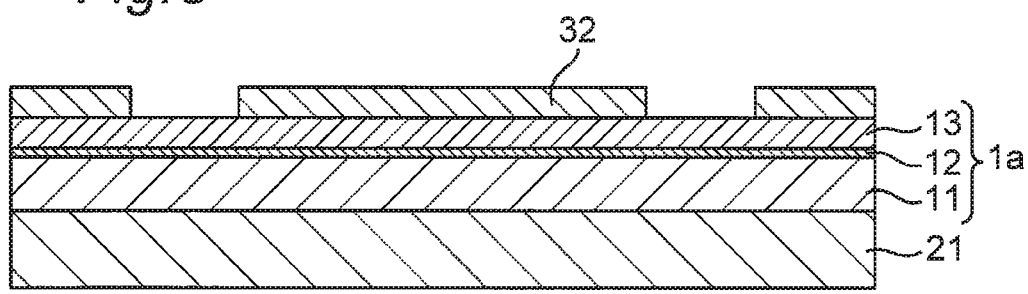
FIG. 8 is a cross-sectional view of second electrodes formed in a predetermined shape by removing the resist formed on the second semiconductor layer of the first wafer, together with the metal film formed on the resist, in the method for manufacturing the light emitting device according to the embodiment.

Subsequently, the resist 51 is removed together with the metal film 32a formed on the resist 51 (see FIG. 8).

In the ways mentioned above, the second electrodes 32 with the predetermined pattern are formed on the second semiconductor layer 13 of the first wafer.

Here, the method for forming the second electrodes 32 with the predetermined pattern by using a lift-off process has been described. However, alternatively, any other method without using the lift-off process may be employed. For example, a metal film may be formed on the entire upper surface of the second semiconductor layer 13 without forming any resist 51, and then a resist may be formed on the metal film. Subsequently, the metal film may be selectively removed using the resist as a mask to thereby form the second electrodes 32 with the predetermined pattern.

Figure 9:
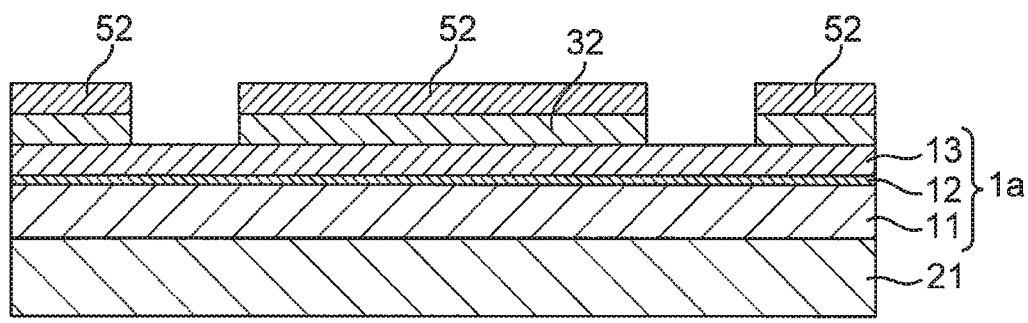
FIG. 9 is a cross-sectional view of a resist formed on the second electrodes in order to form an insulating film between the adjacent second electrodes on the second semiconductor layer of the first wafer in the method for manufacturing the light emitting device according to the embodiment.
Figure 10:
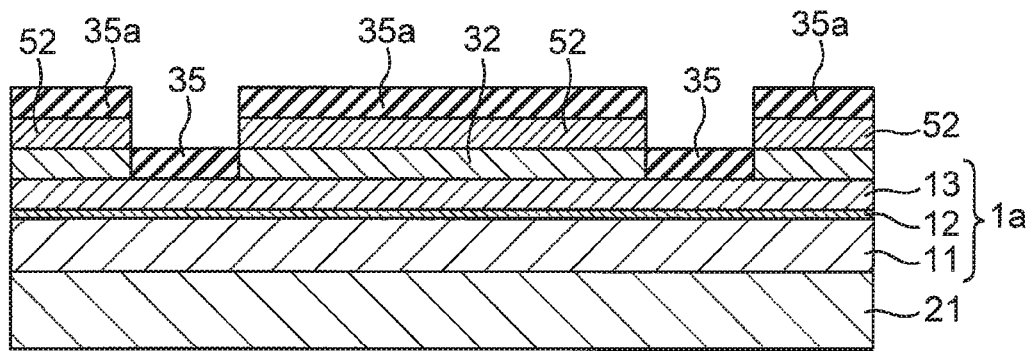
FIG. 10 is a cross-sectional view of the insulating films formed on the resist and between the second electrodes on the second semiconductor layer of the first wafer in the method for manufacturing the light emitting device according to the embodiment.
Figure 11:
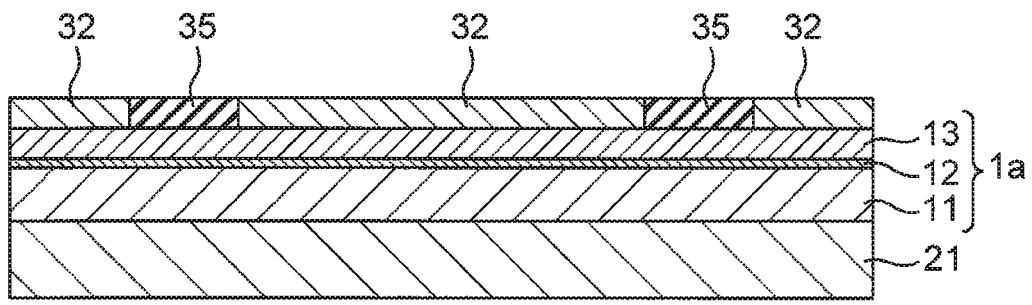
FIG. 11 is a cross-sectional view of the second electrodes and the insulating films formed on the second semiconductor layer of the first wafer by removing the resist, together with the insulating film formed on the resist, in the method for manufacturing the light emitting device according to the embodiment.

Then, a resist 52 is formed on the second electrodes 32 (see FIG. 9). After forming the resist 52, an insulating film is formed on portions of the second semiconductor layer 13 where the second electrodes 32 are not formed, and on the resist 52 (see FIG. 10). Subsequently, the whole resist 52 is removed together with portions of an insulating film 35a formed on the resist 52 (see FIG. 11). In this way, insulating films 35 are formed on portions of the second semiconductor layer 13 where the second electrodes 32 are not formed (see FIG. 11). The insulating films 35 are provided, for example, over cutting positions CL to be mentioned later. With this arrangement, the insulating films 35 can prevent the second electrode 32 from being exposed from both side surfaces of the light emitting device. As a result, the light emitting device can suppress the occurrence of a short circuit on its side surfaces, thereby improving its reliability.

Figure 12:
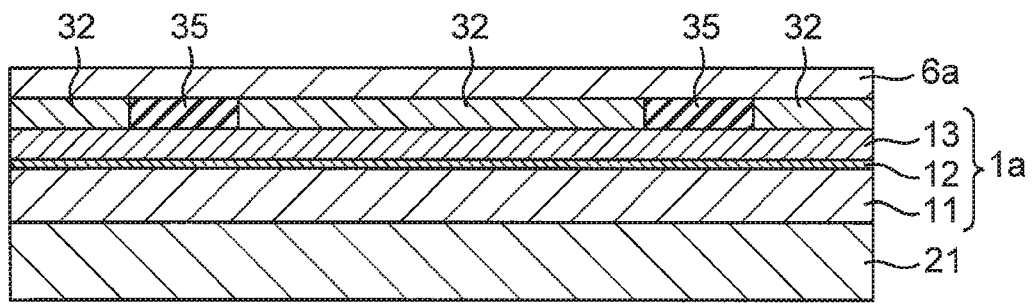
FIG. 12 is a cross-sectional view of a metal layer formed on the second electrodes and the insulating films formed on the second semiconductor layer of the first wafer in the method for manufacturing the light emitting device according to the embodiment.
Figure 13:
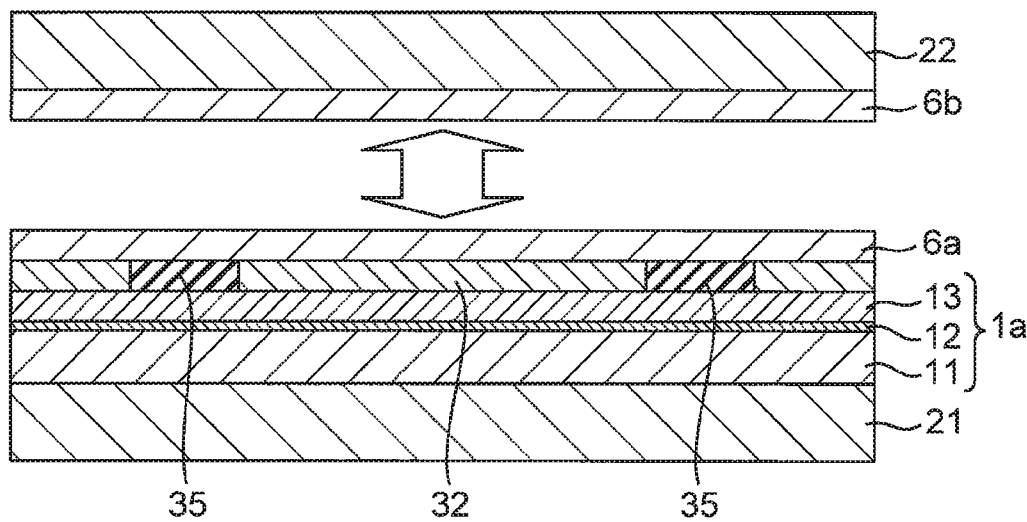
FIG. 13 is a cross-sectional view showing a state of preparing a second substrate 22 having a metal layer formed on one surface thereof and causing the first wafer to face the second substrate 22 in the method for manufacturing the light emitting device according to the embodiment.
Figure 14:
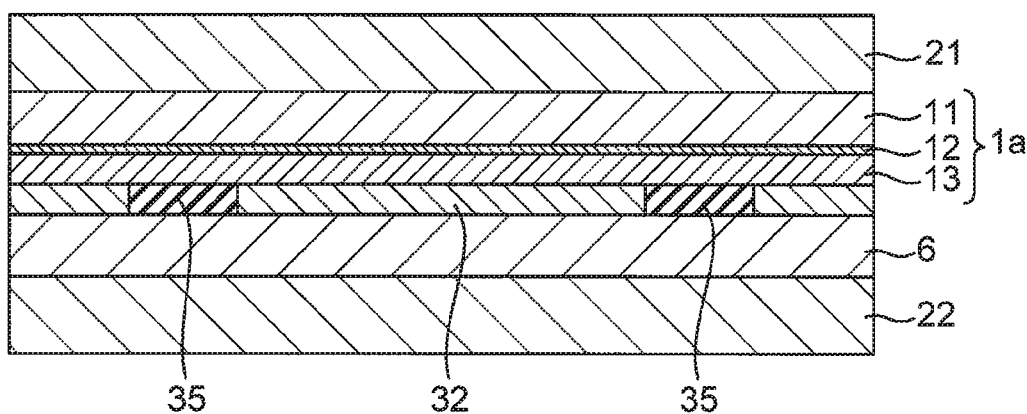
FIG. 14 is a cross-sectional view of the first wafer and the second substrate 22 bonded together by bonding the respective metal layers in the method for manufacturing the light emitting device according to the embodiment.
Figure 15:
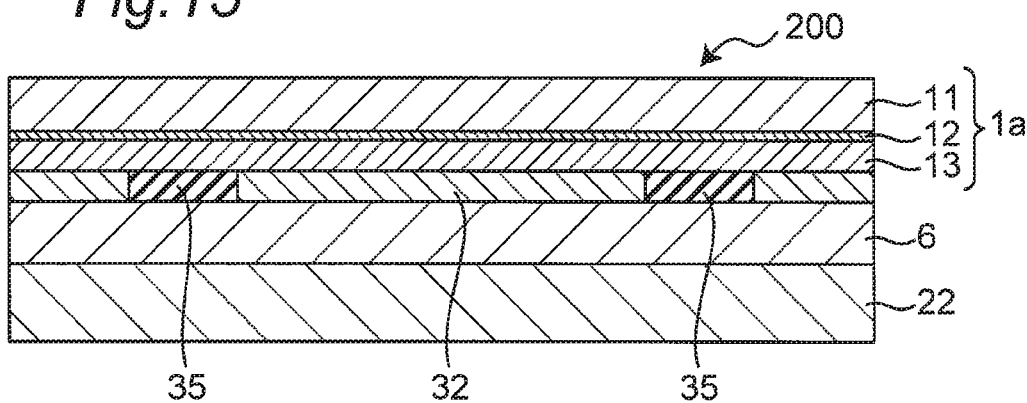
FIG. 15 is a cross-sectional view of a second wafer fabricated in the method for manufacturing the light emitting device according to the embodiment.

Then, a metal layer 6a is formed on the second electrodes 32 and the insulating films 35, which have been formed on the second semiconductor layer 13 (see FIG. 12). Aside from this, a second substrate 22 with a metal layer 6b formed on one surface thereof is prepared. Then, the metal layer 6b and the metal layer 6a are bonded together (see FIG. 13), so that the second substrate 22 is bonded over the second semiconductor layer 13 via the second electrodes 32 and the insulating films 35 (see FIG. 14). Here, the second substrate 22 mentioned above corresponds to the substrate 22 shown in FIG. 1. After bonding the second substrate 22 (see FIG. 14), the first substrate 21 is removed. In the ways mentioned above, the second substrate 22 is bonded with the second semiconductor layer 13 of one first wafer 100, followed by removing the first substrate 21 from the first wafer 100. For example, the removal of the first substrate 21 is performed through laser lift-off by irradiating the vicinity of an interface between the first substrate 21 and the first semiconductor layer 11 with laser light to thereby separate the first substrate 21 from the first semiconductor layer 11. Alternatively, the removal of the first substrate 21 may be performed through wet etching using a solution that enables etching of the first substrate 21. In the ways mentioned above, the unit stacked structure 1a formed on the first wafer 100 is transferred onto the second substrate 22 via the metal layer 6, the second electrodes 32, and the insulating films 35. Consequently, a second wafer 200 including the unit stacked structure 1a is prepared above the second substrate 22, with the first semiconductor layer 11 exposed at the surface of the second wafer (see FIG. 15). That is, in the second wafer 200, the second semiconductor layer 13, the active layer 12, and the first semiconductor layer 11 are stacked in this order over the second substrate 22 via the metal layer 6, the second electrodes 32, and the insulating films 35. Here, the second substrate 22 is preferably a silicon substrate made of Si. By using the second substrate 22 made of a silicon substrate, the second substrate 22 can be easily divided in a cutting step mentioned later.

<First Bonding Step>

In a first bonding step, the first semiconductor layer exposed at the surface of the second wafer 200 and a second semiconductor layer 13 of another first wafer 100 are bonded together using the light-transmissive conductive layer 4 such that the first semiconductor layer of the second wafer 200 and the second semiconductor layer of the another first wafer 100 face each other, and then a first substrate of the another first wafer 100 is removed to expose a first semiconductor layer of the another first wafer 100 at the surface thereof after the removal.

Figure 16:
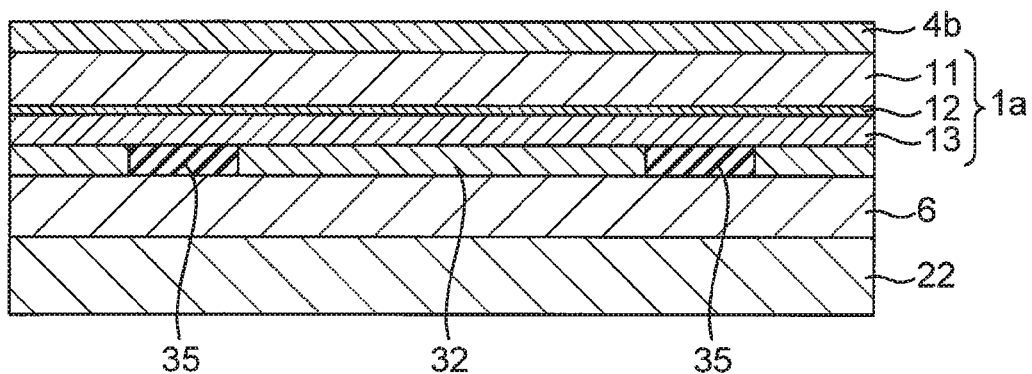
FIG. 16 is a cross-sectional view of a light-transmissive conductive layer formed over the first semiconductor layer of the second wafer in the method for manufacturing the light emitting device according to the embodiment.
Figure 17:
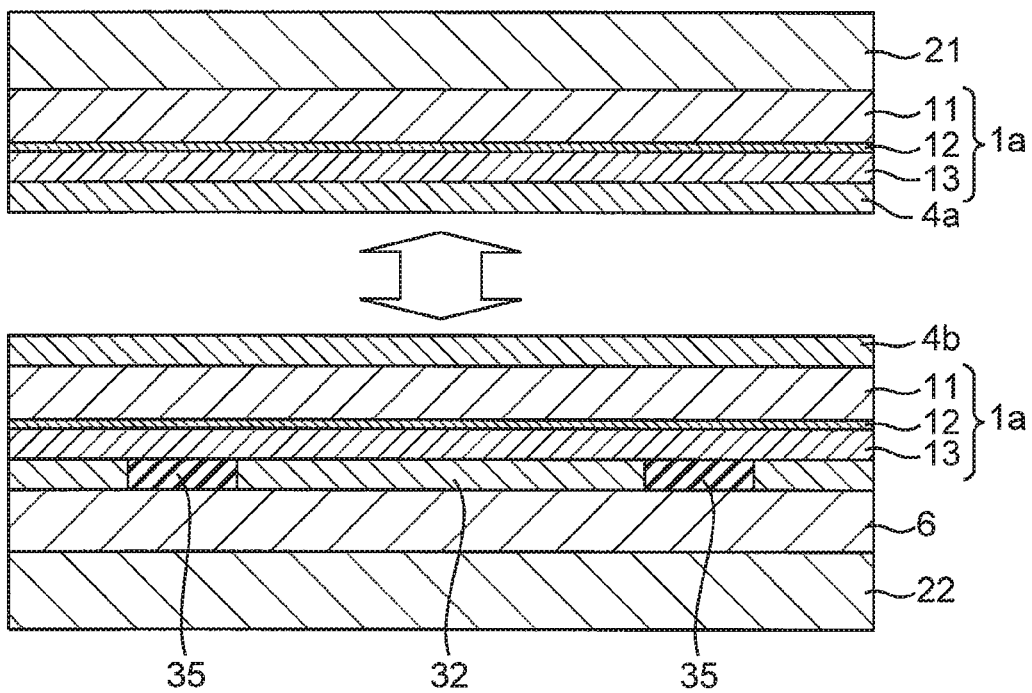
FIG. 17 is a cross-sectional view showing a state of bonding another first wafer having a light-transmissive conductive layer formed over a second semiconductor layer and the second wafer having the light-transmissive conductive layer formed over the surface of the first semiconductor layer in the method for manufacturing the light emitting device according to the embodiment.

Specifically, first, a light-transmissive conductive layer 4b is formed over the surface of the first semiconductor layer 11 in the second wafer 200 (see FIG. 16). Aside from this, a light-transmissive conductive layer 4a is formed over the second semiconductor layer 13 of the another first wafer 100. Then, the light-transmissive conductive layer 4b formed over the surface of the first semiconductor layer 11 in the second wafer 200 is bonded with the light-transmissive conductive layer 4a formed over the second semiconductor layer 13 of the another first wafer 100 (see FIG. 17). The bonding between the light-transmissive conductive layers 4a and 4b is preferably performed by room temperature bonding, such as atomic diffusion bonding or surface activated bonding. Thus, as heat is not transferred to the first semiconductor layer 11, the second semiconductor layer 13, the active layer 12, and the like, the first wafer and the second wafer can be bonded together without degrading or changing the emission properties of the light emitting portions. The surface activated bonding involves activating a bonding interface by applying ion beams, plasma, or the like to the bonding interface, and then directly bonding respective members through the activated interface. Thus, the surface activated bonding method can bond the materials together without interposing any bonding member therebetween, thereby maintaining high light transmittance in the light emitting device even after the bonding. On the other hand, the atomic diffusion bonding method involves bonding members by using atomic diffusion into grain boundaries or surface of a film under a high vacuum. Like the surface activated bonding method, the atomic diffusion bonding method makes it possible to maintain high light transmittance in the light emitting device even after the bonding.

Figure 18:
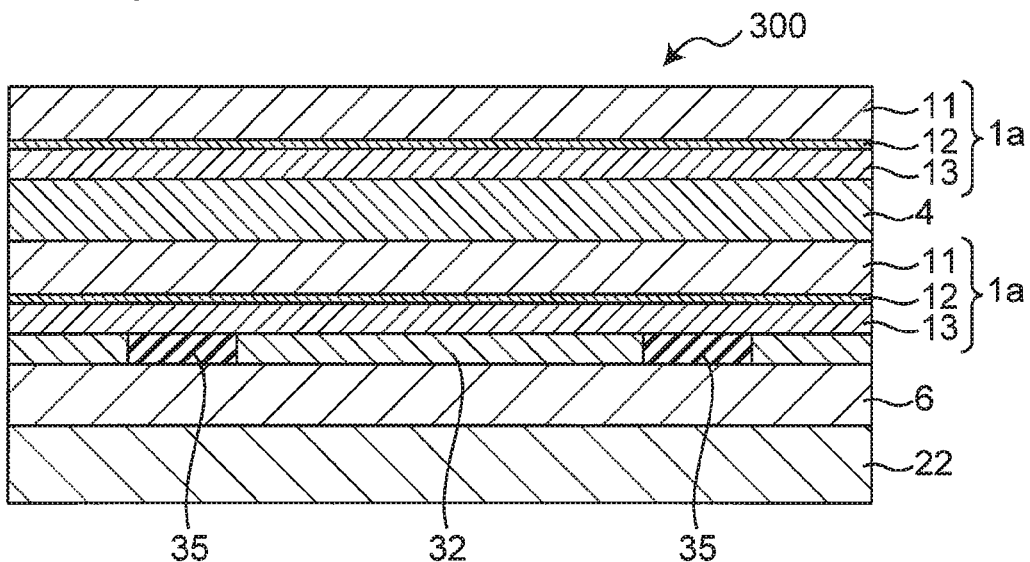
FIG. 18 is a cross-sectional view of a third wafer fabricated in the method for manufacturing the light emitting device according to the embodiment.

After bonding the light-transmissive conductive layers 4a and 4b together, the first substrate 21 of the first wafer 100 is removed to expose the first semiconductor layer 11 (see FIG. 18). The removal of the first substrate 21 can be performed by the laser lift-off process or wet etching, like the above-mentioned method. Here, before forming the light-transmissive conductive layers 4a and 4b, an asperity deformation process is preferably applied onto the surface of the second semiconductor layer 13 in the first wafer 100 on which the light-transmissive conductive layer 4a is to be formed and/or the surface of the first semiconductor layer 11 in the second wafer 200 on which the light-transmissive conductive layer 4b is to be formed. This makes it possible to improve the light extraction efficiency of the light emitting device after fabrication thereof. Such an asperity deformation process is performed, for example, by wet etching.

In the ways mentioned above, a third wafer 300 is prepared, which includes the two unit stacked structures 1a disposed over the second substrate 22 and bonded together using the light-transmissive conductive layer 4 via the metal layer 6, the second electrodes 32, and the insulating films 35.

<Second Bonding Step>

The second bonding step is a step of repeatedly bonding wafers one after another until the desired number of unit stacked structures 1a, each corresponding to the unit light emitting portion 1, are stacked in the case of fabricating a light emitting device that has the desired number of, i.e., more than two unit light emitting portions 1 in the stacked light emitting portion 10.

Figure 19:
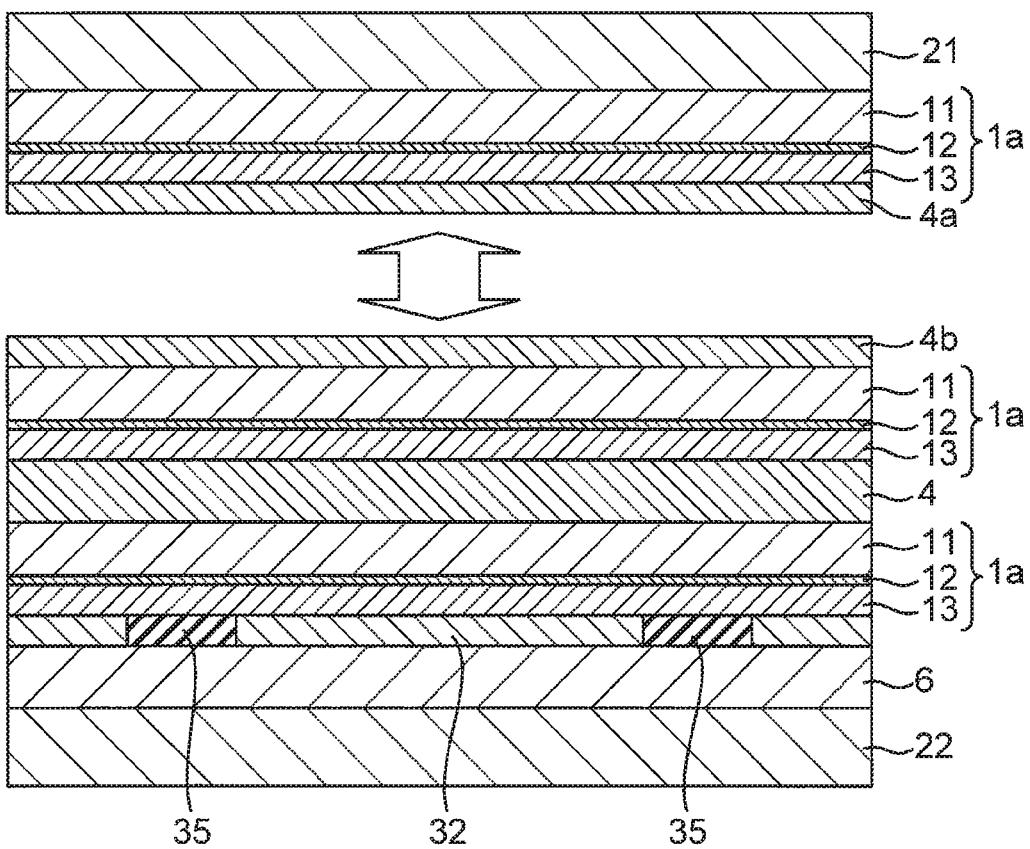
FIG. 19 is a cross-sectional view showing a state of bonding a further first wafer having a light-transmissive conductive layer formed on a second semiconductor layer and the third wafer having a light-transmissive conductive layer formed over the surface of the first semiconductor layer in the method for manufacturing the light emitting device according to the embodiment.

Specifically, first, a light-transmissive conductive layer 4b is formed over the surface of the first semiconductor layer 11 in the third wafer 300. Aside from this, a light-transmissive conductive layer 4a is formed over the second semiconductor layer 13 of another first wafer 100. Then, the light-transmissive conductive layer 4b formed over the surface of the first semiconductor layer 11 in the third wafer 300 is bonded with the light-transmissive conductive layer 4a formed over the second semiconductor layer 13 of the first wafer 100 (see FIG. 19). The bonding between the light-transmissive conductive layers 4a and 4b is preferably performed by room temperature bonding, such as atomic diffusion bonding or surface activated bonding, for the same reasons as those mentioned above.

Figure 20:
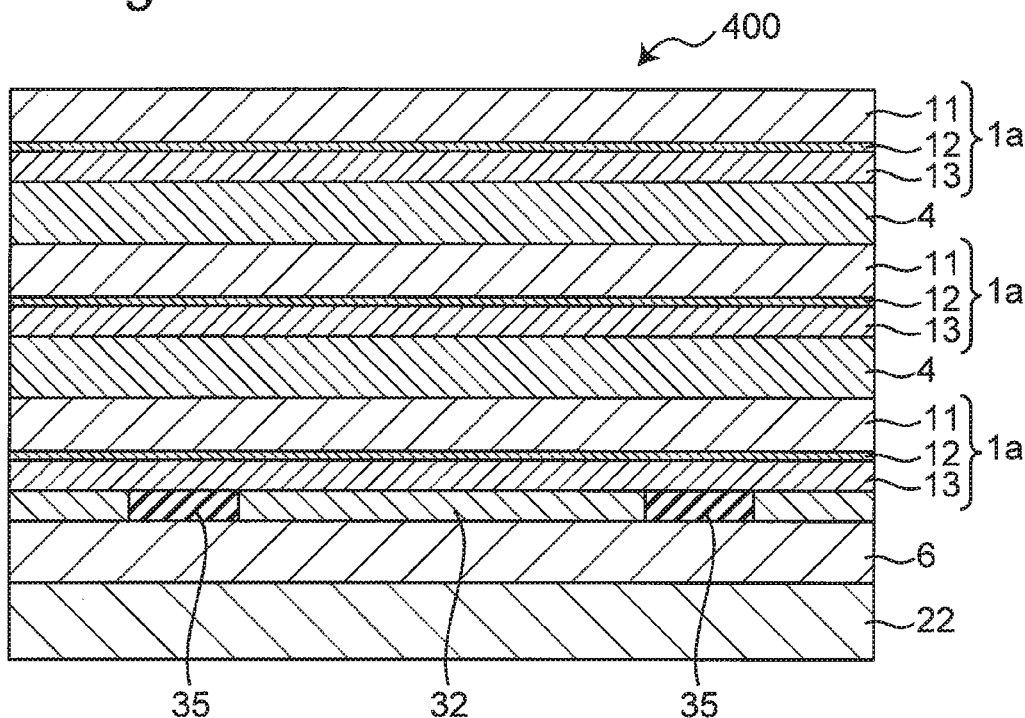
FIG. 20 is a cross-sectional view of a fourth wafer fabricated in the method for manufacturing the light emitting device according to the embodiment.

Then, the first substrate 21 of the first wafer 100 is removed to expose the first semiconductor layer 11 thereof (see FIG. 20). Here, before forming the light-transmissive conductive layers 4a and 4b, the asperity deformation process is preferably applied onto the surface of the second semiconductor layer 13 in the first wafer 100 on which the light-transmissive conductive layer 4a is to be formed and/or the surface of the first semiconductor layer 11 in the third wafer 300 on which the light-transmissive conductive layer 4b is to be formed. This makes it possible to improve the light extraction efficiency of the light emitting device after fabrication thereof.

The bonding procedure including the above-mentioned steps is repeatedly performed until the desired number of unit stacked structures 1a are stacked on each other.

Hereinafter, a fourth wafer 400 is assumed as a wafer including the desired number of unit stacked structures 1a, which are stacked on each other over the second substrate 22. The wafer shown in FIG. 20 is the fourth wafer 400 provided when the desired number is 3 (m=3).

<First Electrode Formation Step>

Here, to begin with, the first electrodes 31 with a predetermined pattern are formed on the first semiconductor layer 11 of the fourth wafer 400 shown in FIG. 20, for example, in the following way.

Figure 21:
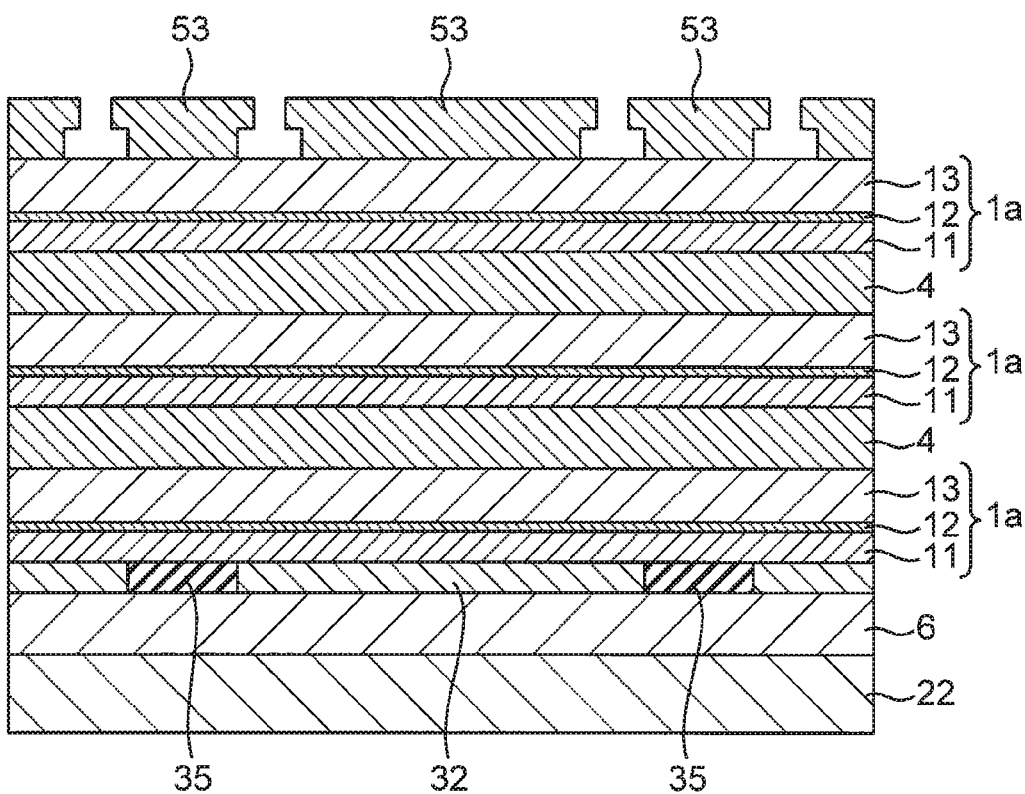
FIG. 21 is a cross-sectional view of a resist for forming first electrodes, which is formed on the first semiconductor layer of the fourth wafer, in the method for manufacturing the light emitting device according to the embodiment.
Figure 22:
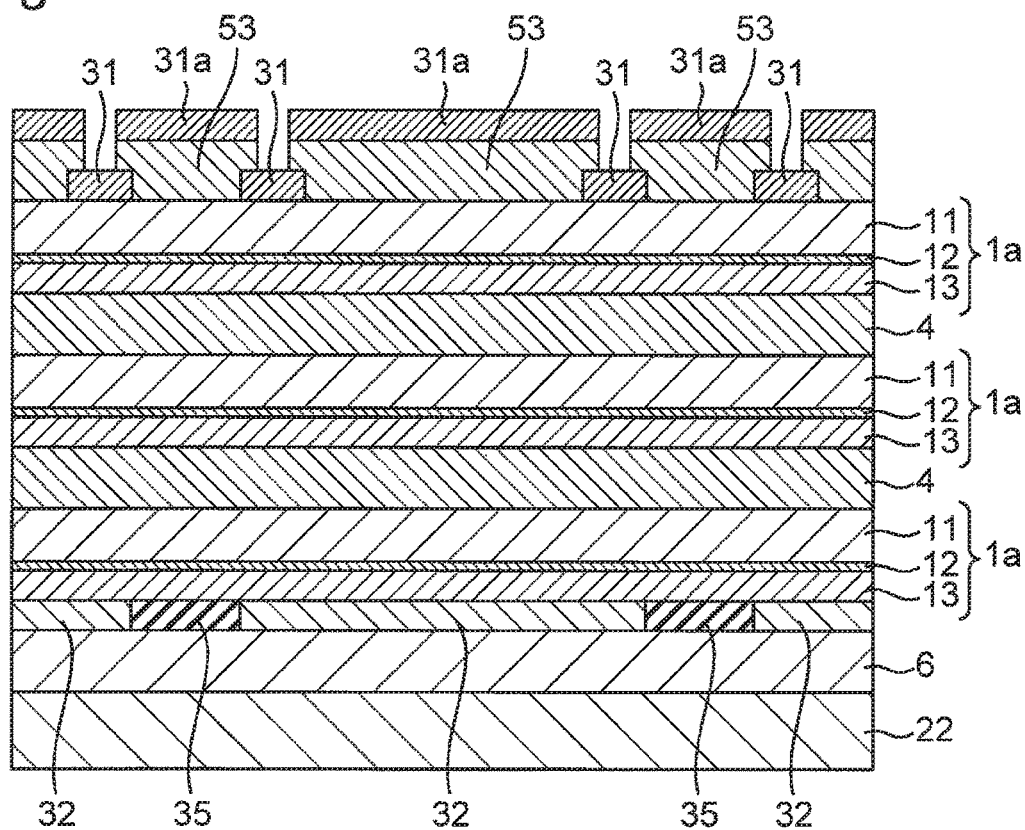
FIG. 22 is a cross-sectional view of a metal film for forming the first electrodes, which is formed on the first semiconductor layer of the fourth wafer, in the method for manufacturing the light emitting device according to the embodiment.

First, a resist 53 is formed on the first semiconductor layer 11 of the fourth wafer 400 (see FIG. 21). At this time, for example, the resist 53 is formed on portions of the first semiconductor layer 11 where the first electrodes are not to be formed. Then, a metal film, for example, containing Au as a main component, is formed over the entire first semiconductor layer 11 (see FIG. 22). Consequently, as shown in FIG. 22, the first electrodes 31 are formed on portions of the first semiconductor layer 11 where the resist 53 is not formed.

Figure 23:
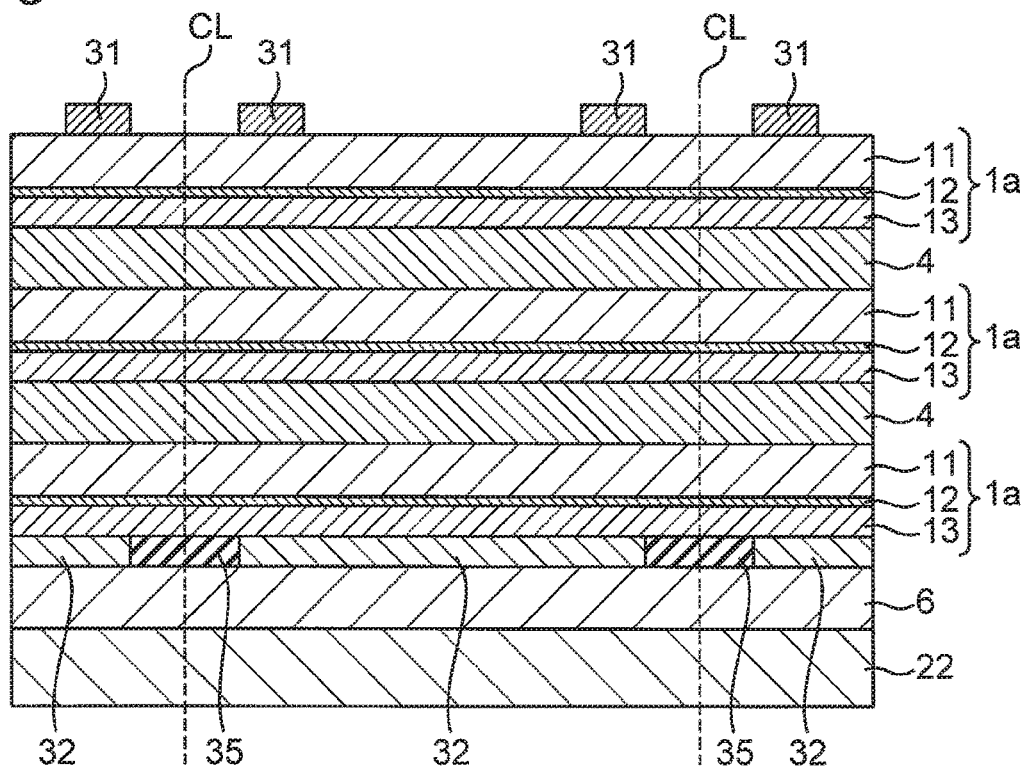
FIG. 23 is a cross-sectional view of the first electrodes formed in a predetermined shape by removing the resist formed on the first semiconductor layer of the fourth wafer, together with the metal film formed on the resist, in the method for manufacturing the light emitting device according to the embodiment.

Subsequently, the resist 53 is removed together with a metal film 31a formed on the resist 53 (see FIG. 23).

In the ways mentioned above, the first electrodes 31 with the predetermined pattern are formed on the first semiconductor layer 11 of the fourth wafer 400.

Here, the method for forming the first electrodes 31 with the predetermined pattern using the lift-off process has been described. However, alternatively, any other method without using the lift-off process may be employed. For example, a metal film may be formed on the entire upper surface of the first semiconductor layer 11 without forming any resist 53, and then a resist may be formed on the metal film. Subsequently, the metal film may be selectively removed using the resist as a mask to thereby form the first electrodes 31 with the predetermined pattern.

<Cutting Step>

Finally, the fourth wafer 400 with the first electrodes 31 formed thereon is divided into individual light emitting devices, each having a desired size. The division is done by dicing at predetermined cutting positions CL.

As mentioned above, the method for manufacturing a light emitting device according to the embodiment includes:

(i) a first wafer preparation step of preparing m first wafers (where m≥2), each of the first wafers including a first semiconductor layer of a first conductivity type (n-type), an active layer, and a second semiconductor layer of a second conductivity type (p-type) different from the first conductivity type (n-type), disposed in sequence on a first substrate (Si substrate) from a side of the first substrate (Si substrate);

(ii) a second wafer preparation step of preparing a second wafer by bonding a second substrate (Si substrate) with the second semiconductor layer of one first wafer and then removing the first substrate (Si substrate) from the first wafer to expose the first semiconductor layer at a surface of the second wafer; and (iii) a first bonding step of bonding the first semiconductor layer exposed at the surface of the second wafer and a second semiconductor layer of another first wafer together using a light-transmissive conductive layer such that the first semiconductor layer of the second wafer and the second semiconductor layer of the another first wafer face each other, and then removing a first substrate (Si substrate) of the another first wafer to expose a first semiconductor layer of the another first wafer at the surface thereof after the removal, the method further including the step of, if m is greater than 2 (m>2), (iv) a second bonding step of bonding the first semiconductor layer exposed by removing the first substrate (Si substrate) and a second semiconductor layer of one remaining first wafer together using a light-transmissive conductive layer such that the exposed first semiconductor layer and the second semiconductor layer of the one remaining first wafer face each other, and then removing a first substrate (Si substrate) of the one remaining first wafer to expose a first semiconductor layer of the one remaining first wafer at the surface thereof after the removal.

According to the method for manufacturing the light emitting device in each of the above-mentioned embodiments, the first electrode 31 and the second electrode 32 can be formed above and below the stacked light emitting portion 10, respectively, so that the formation range per unit area of the active layer 12 in the top view of the light emitting device can be enlarged, thus making it possible to easily manufacture the light emitting device with a large light-emitting area.

The respective components of the light emitting device in the embodiments will be described below.

1. Unit Light Emitting Portion 1 (First Semiconductor Layer 11, Active Layer 12, and Second Semiconductor Layer 13)

Examples of suitable semiconductor material constituting the first semiconductor layer 11, the active layer 12, and the second semiconductor layer include GaN, AlN, InN, and a mixed crystal thereof, namely, a Group III-V nitride semiconductor ($In_XAl_YGa_{1-X-Y}N$ ($0 \leq X$, $0 \leq Y$, $X+Y \leq 1$)); and GaAs-based materials, such as AlGaAs and InGaAs, InP-based materials, such as AlGaInP, and a mixed crystal thereof, namely, another Group III-V compound semiconductor, such as InGaAsP.

In the present embodiment, particularly, preferable semiconductor materials constituting the first semiconductor layer 11, the active layer 12, and the second semiconductor layer include Group III-V nitride semiconductors ($In_XAl_YGa_{1-X-Y}N$ ($0 \leq X$, $0 \leq Y$, $X+Y \leq 1$)). The Group III-V nitride semiconductor may be a mixed crystal in which B is used as a part of the group III elements or as the only group III element, or in which P, As, or Sb atoms are substituted for some N atoms in the group V elements. These nitride semiconductor layers are usually doped with either n-type or p-type impurities. The semiconducting layers can be formed by known techniques, including metal-organic chemical vapor deposition (MOCVD), hydride vapor phase epitaxy (HVPE), molecular beam epitaxy (MBE), and the like.

In the present embodiment, when the first conductivity type is an n-type and the first semiconductor layer 11 is formed of a Group III-V nitride semiconductor, the first semiconductor layer 11 preferably has a layer structure that contains n-type impurities in at least a part thereof and thereby can effectively supply and diffuse carriers to and into the active layer 12 and an electrode formation surface with the first electrode 31 formed thereon. Specifically, in order to supply carriers through in-plane diffusion from the first electrode 31 toward the active layer 12, the first semiconductor layer 11 preferably has a relatively heavily doped n-type contact layer. The n-type contact layer is preferably made of GaN. Furthermore, the first semiconductor layer 11 preferably has an electron diffusion layer made of, for example, AlN, and which moves and supplies charges to the active layer 12 in the stacking direction. Moreover, the first semiconductor layer 11 preferably includes a lightly doped layer doped with a relatively low concentration of n-type impurities, or an undoped layer, which is not doped, between the active layer 12 and the n-type contact layer. The first semiconductor layer 11 preferably includes a multilayer film in place of or in addition to the lightly doped layer or undoped layer. By including the lightly doped layer or undoped layer and/or the multilayer film in this way, the crystallinity of the n-type contact layer grown thereon and/or of the active layer 12 or the like can be improved to promote the in-plane diffusion of current during driving, while improving the breakdown voltage of the whole light emitting device. The multilayer film preferably includes a superlattice structure composed of at least two kinds of layers alternately stacked on each other.

In the present embodiment, when a nitride semiconductor containing In is used in the active layer 12, the light emitting device enables light emission in a region from the ultraviolet region to the visible light (red light) region, and thereby can achieve highlight emission efficiency. For example, when the active layer 12 or a well layer, if the active layer 12 includes the well layer and a barrier layer, is formed of $In_XGa_{1-X}N$, the In composition x is set to obtain a desired emission color. Here, the In composition x may be 0, and by forming the active layer or the well layer using GaN, light having a short wavelength can be emitted. When the well layer is formed of $In_XGa_{1-X}N$, the barrier layer can be formed of a material that has a larger band gap than the well layer, for example, GaN, InGaN, AlGaN, etc. The well layer and the barrier layer may contain n-type impurities, such as Si, and/or p-type impurities, such as Mg, but are preferably undoped.

In the present embodiment, when the second conductivity type is a p-type and the second semiconductor layer 13 is formed of a Group III-V nitride semiconductor, the second semiconductor layer 13 preferably contains a GaN layer, which contains Mg (p-type impurity), as a p-type contact layer with the second electrode 32 formed thereon. The second semiconductor layer 13 preferably contains an AlGaN layer, which contains Mg, between the GaN layer (p-type contact layer) containing Mg and the active layer 12. The thickness of the AlGaN layer is preferably 10 nm or more, thereby making it possible to suppress the overflow of electrons toward the p-type contact layer, thus enhancing the internal quantum efficiency of the unit light emitting portion 1.

In the second semiconductor layer 13, a layer that has a lower impurity concentration than each of the p-type contact layer 7 and the AlGaN layer may be interposed between the p-type contact layer 7 and the AlGaN layer. For example, an undoped GaN film of about 100 nm in thickness is formed as this low-impurity concentration layer, thereby making it possible to form the unit light emitting portion having improved electrostatic breakdown voltage, and also to form the p-type contact layer doped with Mg at a high concentration and having good crystallinity.

2. Light-Transmissive Conductive Layer 4

Materials constituting the light-transmissive conductive layer 4 are preferably those having high light transmittance and electrical conductivity, and for example, a metal oxide, such as ITO or indium-zinc oxide (IZO), can be used. In the present embodiment, the light-transmissive conductive layer 4 is preferably formed using a member that transmits light with the same wavelength as the light from the unit light emitting portion 1. This can suppress the light from the unit light emitting portions 1 from being absorbed in the light-transmissive conductive layer 4, thereby improving the light extraction efficiency of the light emitting device. The light-transmissive conductive layer 4 can be formed by a known technique, for example, a sputtering method, a vapor deposition method, or the like.

3. Metal Layer 6

The metal layer 6 can be formed using a solder material containing AuSn, NiSn, AgSn or the like as a main component, Au or an alloy containing Au as a main component, or the like. The metal layer 6 is preferably provided with another metal layer for improving adhesion to a member forming the metal layer 6. For example, a metal layer made of Pt or Ti can be formed as this adhesion layer. In the present embodiment, the thickness of the metal layer 6a or 6b can be appropriately changed in consideration of the bonding properties and electrical conductivity.

4. Second Electrode 32

The second electrode 32 is preferably formed using a metal layer that contains metal capable of reflecting light with the same wavelength as the light emitted from the unit light emitting portion 1. For example, the second electrode 32 preferably contains metal, such as Ag or Al, or an alloy containing any of these metals as a main component. Consequently, the light from the unit light emitting portion 1 can be reflected toward the first electrode 31, thus improving the light extraction efficiency of the light emitting device. To improve the adhesion or the like, the second electrode 32 may be configured as a multilayer structure that includes metal layers made of Ni, Ti, Pt, and the like. For example, the second electrode 32 can be configured as a multilayer structure that includes a Ag layer, a Ni layer, a Ti layer, and a Pt layer stacked on each other from the surface of the second semiconductor layer 13. The second electrode 32 can be formed by a known technique, for example, the sputtering method, the vapor deposition method, or the like.

5. First Electrode 31

The first electrodes 13 can be formed using a metal layer that contains Au as a main component. To improve the adhesion or to prevent the diffusion of metal elements between metal layers, the first electrode 31 may be configured as a multilayer structure that includes a laminate of the metal layers made of Ti, Pt, Ni, W, Rh, and the like. For example, the first electrode 31 can be configured as a multilayer structure that includes a Ti layer, a Pt layer, an Au layer, and a Ti layer stacked on each other from the surface of the first semiconductor layer 11. The first electrode 31 can be formed by a known technique, for example, the sputtering method, the vapor deposition method, or the like.

6. First Substrate 21

A substrate capable of stacking the first semiconductor layer 11, the active layer 12, and the second semiconductor layer 13, which configure the unit light emitting portion 1, can be used as the first substrate 21. For example, a Si substrate, a sapphire substrate, a gallium arsenide substrate, a GaN substrate, or the like can be used as the first substrate 21. In the present embodiment, particularly, a Si substrate is preferably used as the first substrate 21, thereby making it easier to remove the first substrate 21 from the wafer. The Si substrate is relatively easy to process and can be removed by wet etching or the like. Thus, the removal of the Si substrate by wet etching can reduce damage to the stacked light emitting portion 10 formed of the semiconductor layers, as compared with the case of removal thereof by laser lift-off. The Si substrate may not be made of Si alone, but may be made of a material containing Si as a main component.

7. Second Substrate 22

A substrate made of Si, CuW, Mo, or the like can be used as the second substrate 22. In the present embodiment, the substrate made of Si is preferably used as the second substrate 22, thereby making it possible to easily singulate the wafers in the cutting step, thus improving the productivity of the light emitting devices. When using the substrate made of Si as the second substrate 22, the substrate preferably has a small electric resistance. For this reason, the second substrate 22 may have its resistance reduced, for example, by doping boron or the like into the substrate made of Si.

What is claimed is:

1. A method of manufacturing a light emitting device, the method comprising:
   a first wafer preparation step comprising preparing, m first wafers (where m≥2), each of the m first wafers comprising, in the following order, a first substrate, a first semiconductor layer of a first conductivity type, an active layer, and a second semiconductor layer of a second conductivity type different from the first conductivity type;
   a second wafer preparation step comprising:
      forming a plurality of second electrodes and a plurality of insulating films on the second semiconductor layer of a first of the m first wafers, wherein the insulating films are formed on portions of the second semiconductor layer at which the second electrodes are not formed,
      bonding a second substrate on the second semiconductor layer of the first of the m first wafers via the second electrodes, and then removing the first substrate from the first of the m first wafers, so as to form a second wafer in which the first semiconductor layer is exposed at a surface of the second wafer;
   an asperity formation step comprising forming asperities on a bonding surface of the first semiconductor layer of the second wafer and/or a bonding surface of a second semiconductor layer of a second of the m first wafers;
   after the asperity formation step, at least one bonding step comprising (i) a first bonding step comprising bonding together the bonding surface of the first semiconductor layer exposed at the surface of the second wafer and the bonding surface of the second semiconductor layer of the second of the m first wafers, with the asperities formed on the bonding surface of the first semiconductor layer of the second wafer and/or the bonding surface of the second semiconductor layer of the second of the m first wafers, using a light-transmissive conductive layer, and then removing a first substrate of the second of the m first wafers to expose a first semiconductor layer of the second of the m first wafers at a surface of the second of the m first wafers, so as to form a bonded wafer, and if m is greater than 2 (m>2), (ii) a second bonding step comprising bonding the first semiconductor layer exposed by removing the first substrate in the first bonding step and a second semiconductor layer of a third of the m first wafers together using a light-transmissive conductive layer, and then removing a first substrate of the third of the m first wafers to expose a first semiconductor layer of the third of the m first wafers at a surface of the third of the m first wafers, so as to form a further bonded wafer;

after the at least one bonding step, a dividing step comprising dividing the bonded wafer or the further bonded wafer through the insulating films so as to form a plurality of individual light emitting devices, such that, in each light emitting device, the insulating films are exposed at lateral surfaces of the light emitting device and cover lateral surfaces of the second electrode so that the second electrode is not exposed at the lateral surfaces of the light emitting device.

2. The method of manufacturing a light emitting device according to claim 1, wherein:

if m equals 2, the method further comprises, after the first bonding step, forming a first electrode on an exposed surface of the first semiconductor layer of the second of the m first wafers; and if m is greater than 2 (m>2), the method further comprises, after the second bonding step, forming a first electrode on an exposed surface of the first semiconductor layer of the third of the m first wafers.

3. The method of manufacturing a light emitting device according to claim 1, wherein each of the first and second bonding steps comprises forming a first light-transmissive conductive layer, which is a part of the light-transmissive conductive layer, over the respective second semiconductor layer, forming a second light-transmissive conductive layer over the respective first semiconductor layer and bonding the second light-transmissive conductive layer and the first light-transmissive conductive layer.

4. The method of manufacturing a light emitting device according to claim 2, wherein each of the first and second bonding steps comprises forming a first light-transmissive conductive layer, which is a part of the light-transmissive conductive layer, over the respective second semiconductor layer, forming a second light-transmissive conductive layer over the respective first semiconductor layer and bonding the second light-transmissive conductive layer and the first light-transmissive conductive layer.

5. The method of manufacturing a light emitting device according to claim 3, wherein the second light-transmissive conductive layer and the first light-transmissive conductive layer are bonded by atomic diffusion bonding or surface activated bonding.

6. The method of manufacturing a light emitting device according to claim 4, wherein the second light-transmissive conductive layer and the first light-transmissive conductive layer are bonded by atomic diffusion bonding or surface activated bonding.

7. The method of manufacturing a light emitting device according to claim 1, wherein the second substrate is bonded over the second semiconductor layer of the first of the m first wafers via a metal layer.

8. The method of manufacturing a light emitting device according to claim 2, wherein the second substrate is bonded over the second semiconductor layer of the first of the m first wafers via a metal layer.

9. The method of manufacturing a light emitting device according to claim 3, wherein the second substrate is bonded over the second semiconductor layer of the first of the m first wafers via a metal layer.

10. The method of manufacturing a light emitting device according to claim 1, wherein the first and second substrates are made of Si.

11. The method of manufacturing a light emitting device according to claim 2, wherein the first and second substrates are made of Si.

12. The method of manufacturing a light emitting device according to claim 3, wherein the first and second substrates are made of Si.

13. The method of manufacturing a light emitting device according to claim 1, wherein the light-transmissive conductive layer is made of indium tin oxide.

14. The method of manufacturing a light emitting device according to claim 2, wherein the light-transmissive conductive layer is made of indium tin oxide.

15. The method of manufacturing a light emitting device according to claim 3, wherein the light-transmissive conductive layer is made of indium tin oxide.

16. The method of manufacturing a light emitting device according to claim 1, wherein each first semiconductor layer is made of an n-type nitride semiconductor, each active layer is made of a nitride semiconductor, and each second semiconductor layer is made of a p-type nitride semiconductor.

17. The method of manufacturing a light emitting device according to claim 1, wherein the dividing step is carried out by dicing the bonded wafer or the further bonded wafer.

18. The method of manufacturing a light emitting device according to claim 1, wherein the asperity formation step comprises forming asperities at least on the bonding surface of each second semiconductor layer.

19. The method of manufacturing a light emitting device according to claim 1, wherein the asperity formation step comprises forming asperities on the bonding surface of each first semiconductor layer and the bonding surface of each second semiconductor layer.

20. The method of manufacturing a light emitting device according to claim 2, wherein each of the second electrodes contains metal.

* * * * *